US010032624B2

(12) United States Patent
Gouk et al.

(10) Patent No.: US 10,032,624 B2
(45) Date of Patent: Jul. 24, 2018

(54) SUBSTRATE SUPPORT AND BAFFLE APPARATUS

(71) Applicant: Applied Materials, Inc., Santa Clara, CA (US)

(72) Inventors: Roman Gouk, San Jose, CA (US); Han-Wen Chen, San Mateo, CA (US); Steven Verhaverbeke, San Francisco, CA (US); Jean Delmas, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 15/268,180

(22) Filed: Sep. 16, 2016

(65) Prior Publication Data
US 2017/0098542 A1 Apr. 6, 2017

Related U.S. Application Data

(60) Provisional application No. 62/236,915, filed on Oct. 4, 2015.

(51) Int. Cl.
*H01L 21/02* (2006.01)
*H01L 21/687* (2006.01)
*H01L 21/67* (2006.01)

(52) U.S. Cl.
CPC .... *H01L 21/02101* (2013.01); *H01L 21/6719* (2013.01); *H01L 21/67034* (2013.01);
(Continued)

(58) Field of Classification Search
CPC ........... H01L 21/6875; H01L 21/68714; H01L 21/68728; H01L 21/68785
See application file for complete search history.

(56) References Cited

U.S. PATENT DOCUMENTS

| 5,417,768 A | 5/1995 | Smith, Jr. et al. |
| 6,168,668 B1 * | 1/2001 | Yudovsky ............... H01L 21/68 118/715 |

(Continued)

FOREIGN PATENT DOCUMENTS

| CN | 1958177 A | 5/2007 |
| CN | 1960813 A | 5/2007 |

(Continued)

OTHER PUBLICATIONS

Taiwan Office Action in related application TW 102140520 dated Apr. 17, 2017.

(Continued)

*Primary Examiner* — Kaitlin S Joerger
(74) *Attorney, Agent, or Firm* — Patterson + Sheridan LLP (57) ABSTRACT

A substrate support apparatus is provided. The apparatus includes a circular base plate and one or more spacers disposed about a circumference of the base plate. The spacers may extend from a top surface of the base plate and a ring body may be coupled to the spacers. The ring body may be spaced from the base plate to define apertures between the base plate and the ring body. One or more support posts may be coupled to the base plate and extend therefrom. The support posts may be coupled to the base plate at positions radially inward from an inner surface of the ring body.

18 Claims, 10 Drawing Sheets

(52) U.S. Cl.
CPC .. *H01L 21/68728* (2013.01); *H01L 21/68785* (2013.01); *H01L 21/02057* (2013.01)

(56) References Cited

U.S. PATENT DOCUMENTS

| | | | |
|---|---|---|---|
| 6,216,364 B1 | 4/2001 | Tanaka et al. | |
| 6,217,034 B1* | 4/2001 | Smedt | B25B 5/06 |
| | | | 118/503 |
| 6,286,231 B1 | 9/2001 | Bergman et al. | |
| 6,306,564 B1 | 10/2001 | Mullee | |
| 6,508,259 B1 | 1/2003 | Tseronis et al. | |
| 6,562,146 B1 | 5/2003 | Deyoung et al. | |
| 6,745,494 B2 | 6/2004 | Bergman et al. | |
| 6,764,552 B1 | 7/2004 | Joyce et al. | |
| 6,793,836 B2 | 9/2004 | Tsung-Kuei et al. | |
| 6,827,092 B1* | 12/2004 | Smith | H01L 21/68728 |
| | | | 134/147 |
| 6,843,855 B2 | 1/2005 | Verhaverbeke | |
| 7,000,621 B1 | 2/2006 | Verhaverbeke | |
| 7,077,585 B2* | 7/2006 | Ito | G03F 7/3021 |
| | | | 118/52 |
| 7,384,484 B2 | 6/2008 | Muraoka et al. | |
| 7,866,058 B2* | 1/2011 | Kim | B23B 31/28 |
| | | | 118/313 |
| 7,998,308 B2* | 8/2011 | Kaneko | H01L 21/67051 |
| | | | 134/119 |
| 8,256,774 B2* | 9/2012 | Cho | B23B 31/1269 |
| | | | 118/730 |
| 8,690,135 B2* | 4/2014 | Vekstein | H01L 21/6875 |
| | | | 269/21 |
| 8,852,349 B2* | 10/2014 | Chacin | C23C 16/45521 |
| | | | 118/728 |
| 8,933,375 B2* | 1/2015 | Dunn | H01L 21/67109 |
| | | | 118/724 |
| 9,147,593 B2* | 9/2015 | Lach | H01L 21/67051 |
| 9,165,812 B2* | 10/2015 | Ouye | H01L 21/683 |
| 9,245,777 B2* | 1/2016 | Plazonic | H01L 21/67115 |
| 9,390,947 B2* | 7/2016 | Ito | H01L 21/67115 |
| 9,418,883 B2* | 8/2016 | Gleissner | H01L 21/68721 |
| 9,555,437 B2* | 1/2017 | Nakai | B05C 11/1039 |
| 2002/0062792 A1* | 5/2002 | Boydston | C23C 16/455 |
| | | | 118/728 |
| 2002/0195121 A1 | 12/2002 | Kittle | |
| 2003/0022487 A1 | 1/2003 | Yoon et al. | |
| 2003/0075536 A1 | 4/2003 | Mack et al. | |
| 2003/0102017 A1 | 6/2003 | Taniyama | |
| 2004/0072706 A1 | 4/2004 | Arena-Foster et al. | |
| 2004/0149226 A1* | 8/2004 | Chen | H01L 21/68728 |
| | | | 118/728 |
| 2004/0198066 A1 | 10/2004 | Verhaverbeke | |
| 2005/0191861 A1 | 9/2005 | Verhaverbeke | |
| 2005/0242064 A1 | 11/2005 | Saito et al. | |
| 2006/0027323 A1* | 2/2006 | Miya | H01L 21/68728 |
| | | | 156/345.23 |
| 2006/0223899 A1 | 10/2006 | Hillman et al. | |
| 2007/0221252 A1 | 9/2007 | Kiyose | |
| 2007/0256632 A1* | 11/2007 | Pham | H01L 21/68728 |
| | | | 118/52 |
| 2007/0287277 A1 | 12/2007 | Kolics et al. | |
| 2007/0295365 A1 | 12/2007 | Miya et al. | |
| 2008/0153276 A1 | 6/2008 | Hwang et al. | |
| 2008/0224379 A1 | 9/2008 | McNamara | |
| 2009/0151754 A1 | 6/2009 | Zhu et al. | |
| 2011/0146909 A1 | 6/2011 | Shih et al. | |
| 2012/0055405 A1* | 3/2012 | Koelmel | H01L 21/6838 |
| | | | 118/725 |
| 2012/0085495 A1 | 4/2012 | Lee et al. | |
| 2012/0103264 A1 | 5/2012 | Choi et al. | |
| 2012/0111379 A1 | 5/2012 | Nixon et al. | |
| 2013/0192628 A1 | 8/2013 | Mori et al. | |
| 2013/0302982 A1 | 11/2013 | Tung et al. | |
| 2014/0014644 A1* | 1/2014 | Akiba | H01L 21/67103 |
| | | | 219/444.1 |
| 2014/0144462 A1 | 5/2014 | Verhaverbeke et al. | |
| 2014/0169772 A1* | 6/2014 | Abe | H01L 21/6875 |
| | | | 392/418 |
| 2014/0329340 A1* | 11/2014 | Yokouchi | H01L 21/265 |
| | | | 438/10 |
| 2015/0262859 A1 | 9/2015 | Balasubramanian et al. | |
| 2015/0279721 A1* | 10/2015 | Kikumoto | H01L 21/68785 |
| | | | 279/128 |
| 2016/0108539 A1* | 4/2016 | Yahagi | H01L 21/67126 |
| | | | 204/242 |
| 2016/0279678 A1* | 9/2016 | Yoshitomi | H01L 21/67051 |
| 2016/0351424 A1* | 12/2016 | Fuse | H01L 21/67115 |

FOREIGN PATENT DOCUMENTS

| | | |
|---|---|---|
| CN | 102386052 A | 3/2012 |
| EP | 1172458 A2 | 1/2002 |
| JP | 2005-116759 A | 4/2005 |
| JP | 2006-179913 A | 7/2006 |
| JP | 2014-241450 A | 12/2014 |
| KR | 10-0171945 | 3/1999 |
| KR | 10-2005-0032943 A | 4/2005 |
| KR | 100730348 B1 | 6/2007 |
| KR | 10-2005-0063720 | 11/2007 |
| KR | 10-2007-0113096 | 11/2007 |
| KR | 10-2008-0002633 | 1/2008 |
| KR | 10-0822373 B1 | 4/2008 |
| KR | 10-2013-0063761 | 6/2013 |
| KR | 10-2014-0115795 A | 10/2014 |

OTHER PUBLICATIONS

International Search Report and Written Opinion for related application PCT/US2016/051582 dated Dec. 22, 2016.
International Search Report an Written Opinion for International Application No. PCT/US2016/051341 dated Dec. 20, 2016.
International Search Report & Written Opinion dated Mar. 17, 2014 for Application No. PCT/US2013/071314.
International Search Report and Written Opinion of related application PCT/US2016/051480 dated Jan. 5, 2017.
International Search Report and Written Opinion of related application PCT/US2016/051520 dated Dec. 26, 2016.
International Search Report and Written Opinion, PCT/US2015/039974, dated Oct. 29, 2015.

* cited by examiner

SUBSTRATE SUPPORT AND BAFFLE APPARATUS

CROSS-REFERENCE TO RELATED APPLICATIONS

This application claims priority to U.S. Provisional Patent Application No. 62/236,915, filed Oct. 4, 2015, the entirety of which is herein incorporated by reference.

BACKGROUND

Field

Embodiments of the present disclosure generally relate to supercritical drying apparatus. More specifically, embodiments described herein relate to a substrate support and baffle apparatus.

Description of the Related Art

In the cleaning of semiconductor devices, it is often desirable to remove liquid and solid contaminants from surfaces of a substrate, thus leaving clean surfaces. Wet cleaning processes generally involve the use of cleaning liquids, such as aqueous cleaning solutions. After wet cleaning the substrate, it is often desirable to remove the cleaning liquid from the surface of the substrate in a cleaning chamber.

Most current wet cleaning techniques utilize a liquid spraying or immersion step to clean the substrate. Drying of the substrate that has high aspect ratio features or low-k materials which have voids or pores is very challenging subsequent to the application of a cleaning liquid. Capillary forces of the cleaning liquid often cause deformation of materials in these structures which can create undesired stiction, which can damage the semiconductor substrate in addition to leaving residue on the substrate from the cleaning solution utilized. The aforementioned drawbacks are especially apparent on substrates with high-aspect-ratio semiconductor device structures during subsequent drying of the substrate. Line stiction, or line collapse, results from bending of the side walls, which form the high-aspect-ratio trench or via, towards each other due to capillary pressure across the liquid-air interface over the liquid trapped in the trench or via during the wet cleaning process(es). Features with narrow line width and high-aspect-ratios are especially susceptible to the difference in surface tension created between liquid-air and liquid-wall interfaces due to capillary pressure, which is also sometimes referred to as capillary force. Current workable drying practices are facing a steeply rising challenge in preventing line stiction as a result of rapid device scaling advancements.

Moreover, particle generation and particle deposition on a substrate are particular areas of concern when performing phase transition processes. High pressures within a processing environment may contribute to particle generation and various fluids introduced to the processing environment may also contribute to particle deposition on the substrate. As a result, device performance may be degraded by the presence of undesirable particles on a substrate As a result, there is a need in the art for improved apparatus for performing phase transition and supercritical processing operations.

SUMMARY

In one embodiment, a substrate support apparatus is provided. The apparatus includes a circular base plate and one or more spacers disposed about a circumference of the base plate. The spacers may extend from a top surface of the base plate and a ring body may be coupled to the spacers. The ring body may be spaced from the base plate to define apertures between the base plate and the ring body. One or more support posts may be coupled to the base plate and extend therefrom. The support posts may be coupled to the base plate at positions radially inward from an inner surface of the ring body.

In another embodiment, a substrate support apparatus is provided. The apparatus includes a circular base plate and one or more spacers disposed about a circumference of the base plate. The spacers may extend from a top surface of the base plate and a ring body may be coupled to the spacers. The ring body may be spaced from the base plate to define apertures between the base plate and the ring body. One or more support posts may be coupled to the base plate and extend therefrom. The support posts may be coupled to the base plate at positions radially inward from an inner surface of the ring body and a circular baffle plate may be coupled to a top surface of the ring body. One or more positioning elements may extend from a bottom surface of the baffle plate and the positioning elements may be disposed about a circumference of the baffle plate.

In yet another embodiment, a substrate support method is provided. The method includes positioning a substrate, device side down, on one or more support posts coupled to a base plate of a substrate support. A ring body may be coupled to the base plate and positioned about a circumference of the base plate. A baffle plate may be positioned over the substrate and the baffle plate may be coupled to the ring body. The substrate, the substrate support, and the ring body, and the baffle plate may be positioned in a processing chamber and the substrate may be exposed to supercritical $CO_2$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, for purposes of explanation, numerous specific details are set forth in order to provide a thorough understanding of the embodiments provided herein. However, it will be evident to one skilled in the art that the present disclosure may be practiced without these specific details. In other instances, specific apparatus structures have not been described so as not to obscure embodiments described. The following description and figures are illustrative of the embodiments and are not to be construed as limiting the disclosure.

Figure 1:
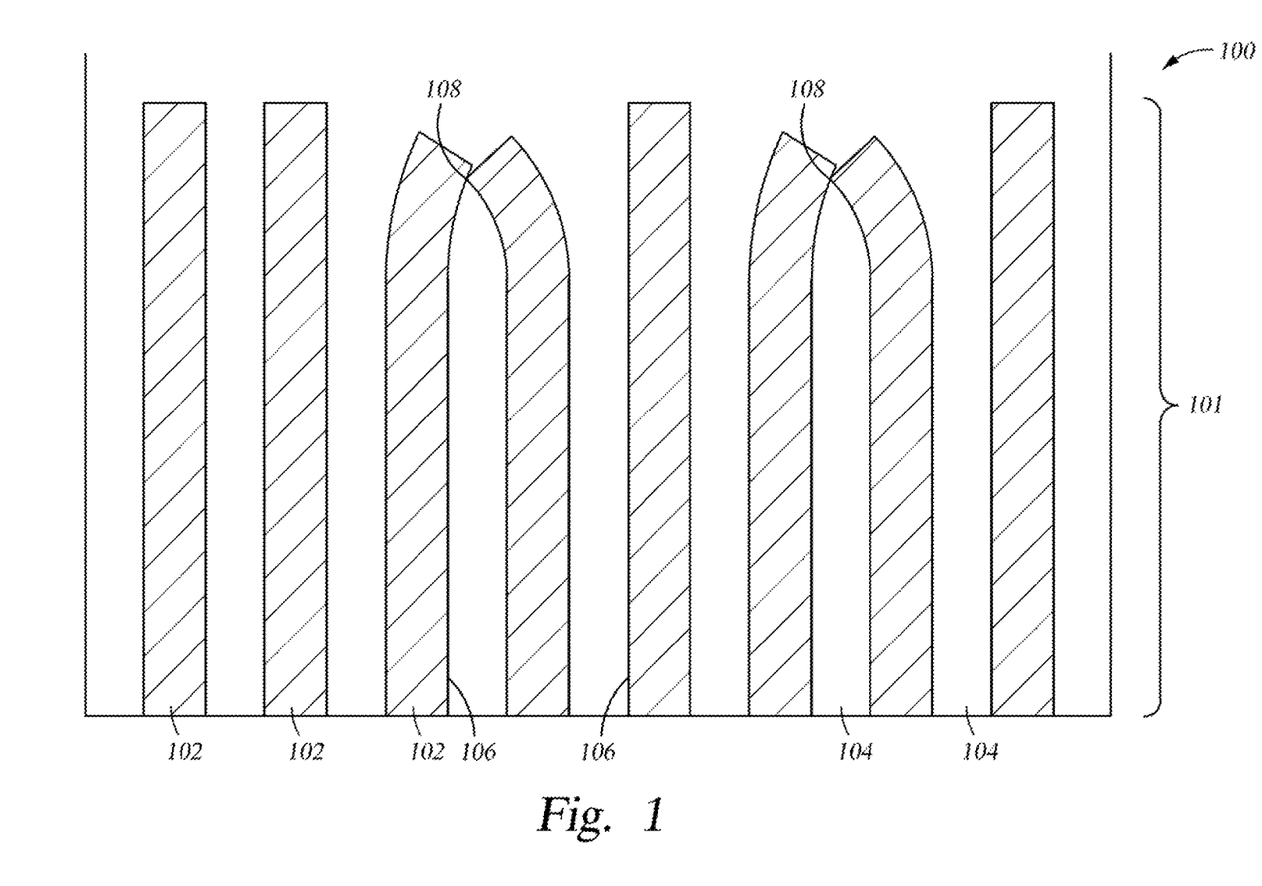
FIG. 1 illustrates the effect of stiction created between features formed on a semiconductor substrate according to embodiments described herein.

FIG. 1 is a schematic cross-sectional view that illustrates a portion of a semiconductor device 100 in which line stiction has occurred between two features within the semiconductor device 100. As shown, the high aspect ratio device structures are formed on a surface of a substrate. During processing, device structures 102 should remain in a vertical orientation and walls 106 should not cross the openings 104 and contact adjacent walls 106 of the device structures 102. When the semiconductor device 100 is being dried after being cleaned with wet chemistries, the walls 106 of the device structures 102 are subjected to capillary forces due to the air-liquid interface created by the cleaning liquid disposed within the opening 104, which causes the walls 106 of adjacent device structures 102 to bend towards one another and contact each other. Line stiction results from the contact between walls 106 of adjacent device structures 102, ultimately causing closure of the openings 104. Line stiction is generally undesirable because it prevents access to the openings 104 during subsequent substrate processing steps, such as further deposition steps.

To prevent line stiction, a substrate may be exposed to an aqueous cleaning solution, such as de-ionized water or cleaning chemicals, in a wet clean chamber. Such a substrate includes a semiconductor substrate having electronic devices disposed or formed thereon. The use of the aqueous cleaning solutions on the substrate in a wet clean chamber removes residues left on the substrate after the wet cleaning processes have been performed. In some configurations, the wet clean chamber may be a single wafer cleaning chamber and/or a horizontal spinning chamber. Additionally, the wet clean chamber may have a megasonic plate adapted to generate acoustic energy directed onto the non-device side of the substrate.

After wet cleaning the substrate, the substrate may be transferred to a solvent exchange chamber to displace any previously used aqueous cleaning solutions used in the wet clean chamber. The substrate may then be transferred to a supercritical fluid chamber for further cleaning and drying steps to be performed on the substrate. In one embodiment, drying the substrate may involve the delivery of a supercritical fluid to a surface of the substrate. A drying gas may be selected to transition into a supercritical state when subjected to certain pressure and temperature configurations that are achieved or maintained in the supercritical processing chamber. One example of such a drying gas includes carbon dioxide ($CO_2$). Since supercritical $CO_2$ is a supercritical gas, it has no surface tension in that its surface tension is similar to a gas, but has densities that are similar to a liquid. Supercritical $CO_2$ has a critical point at a pressure of about 73.0 atm and a temperature of about 31.1° C. One unique property of a supercritical fluid, such as $CO_2$, is that condensation will not occur at any pressure above the supercritical pressure and temperatures above the supercritical point (e.g., 31.1° C. and 73 atm for $CO_2$). Critical temperature and critical pressure parameters of a processing environment, such as a processing chamber, influence the supercritical state of the $CO_2$ drying gas.

The supercritical fluid, due to its unique properties, may penetrate substantially all pores or voids in the substrate and remove any remaining liquids or particles that may be present in the openings 104. In one embodiment, after the supercritical processing has proceeded for a desired period of time to remove particles and residues, the pressure of the chamber is decreased at a nearly constant temperature, allowing the supercritical fluid to transition directly to a gaseous phase within the openings 104. Liquids typically present in the openings 104 prior to supercritical fluid treatment may be displacement solvents from the solvent exchange chamber. Particles typically present in the openings 104 may be any solid particulate matter, such as organic species (i.e., carbon), inorganic species (i.e. silicon), and/or metals. Examples of openings 104 that may be dried by supercritical fluid include voids or pores in a dielectric layer, voids or pores in a low-k dielectric material, and other types of gaps in the substrate that may trap cleaning fluids and particles. Moreover, supercritical drying may prevent line stiction by bypassing the liquid state during phase transition and eliminating capillary forces created between the walls 106 of the device structures 102 due to the due to the negligible surface tension of supercritical fluid, such as supercritical $CO_2$.

The substrate may then be transferred from the supercritical fluid chamber to a post processing chamber. The post processing chamber may be a plasma processing chamber, in which contaminants that may be present on the substrate may be removed. Post processing the substrate may also further release any line stiction present in the device structures. The processes described herein are useful for cleaning device structures having high aspect ratios, such as aspect ratios of about 10:1 or greater, 20:1 or greater, or 30:1 or greater. In certain embodiments, the processes described herein are useful for cleaning 3D/vertical NAND flash device structures.

Figure 2A:
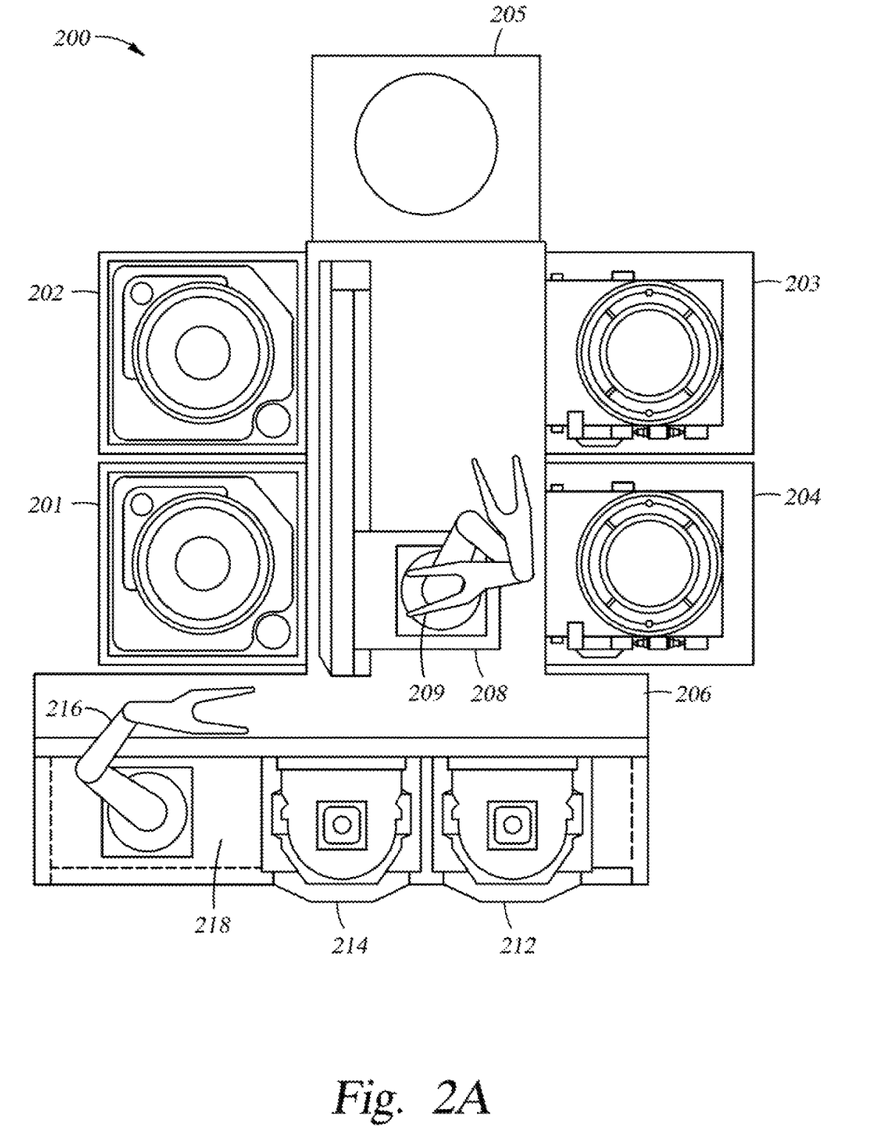
FIG. 2A illustrates a plan view of processing apparatus according to one embodiment described herein.

FIG. 2A illustrates a substrate processing apparatus that may be adapted to perform one or more of the operations described above, according to one embodiment of the present disclosure. In one embodiment, the processing apparatus 200 comprises a wet clean chamber 201, a solvent exchange chamber 202, a supercritical fluid chamber 203, a post processing chamber 204, a transfer chamber 206, and a wet robot 208. Processing a substrate may include, but is not limited to, forming electrical devices such as transistors, capacitors, or resistors, that are interconnected by metal lines, which are insulated by interlayer dielectrics upon the substrate. These processes may include cleaning the substrate, cleaning films formed on the substrate, drying the substrate, and drying films formed on the substrate. In another embodiment, the processing apparatus 200 includes an inspection chamber 205, which may include tools (not shown) to inspect substrates that have been processed in the processing apparatus 200.

In one embodiment, the substrate processing apparatus 200 is a cluster tool comprising several substrate processing chambers, such as the wet clean chamber 201, the solvent exchange chamber 202, the supercritical fluid chamber 203, the post processing chamber 204, and the transfer chamber 206. The chambers 201, 202, 203, 204 may be positioned about the wet robot 208 which may be disposed in the transfer chamber 206. The wet robot 208 comprises a motor, a base, an arm, and an end effector 209 configured to transfer substrates between the chambers. Optionally, the wet robot 208 may have multiple arms and multiple end effectors to increase the throughput of the processing apparatus 200. In one embodiment, the wet robot 208 transfers substrates between the aforementioned chambers. In another embodiment, at least one of the end effectors of the wet robot 208 is a dedicated dry end effector (e.g., adapted to handle dry wafers) and at least one of the end effectors of the wet robot 208 is a dedicated wet end effector (e.g., adapted to handle wet wafers). The dedicated dry end effector may be used to transfer substrates between the supercritical fluid chamber 203 and the post processing chamber 204.

The processing apparatus 200 also comprises a dry robot 216 disposed in a factory interface 218 which may be coupled to the processing apparatus 200 and a plurality of substrate cassettes 212 and 214, each holding a plurality of substrates to be cleaned or dried, or that have been cleaned or dried. The dry robot 216 may be configured to transfer substrates between the cassettes 212 and 214 and the wet clean chamber 201 and post processing chamber 204. In another embodiment, the dry robot 216 may be configured to transfer substrates between the supercritical fluid chamber 203 and the post processing chamber 204. The processing chambers within the processing apparatus 200 may be placed on a horizontal platform which houses the substrate transfer chamber 206. In another embodiment, a portion of the platform may be oriented in a position other than a horizontal orientation (See FIG. 5).

Figure 2B:
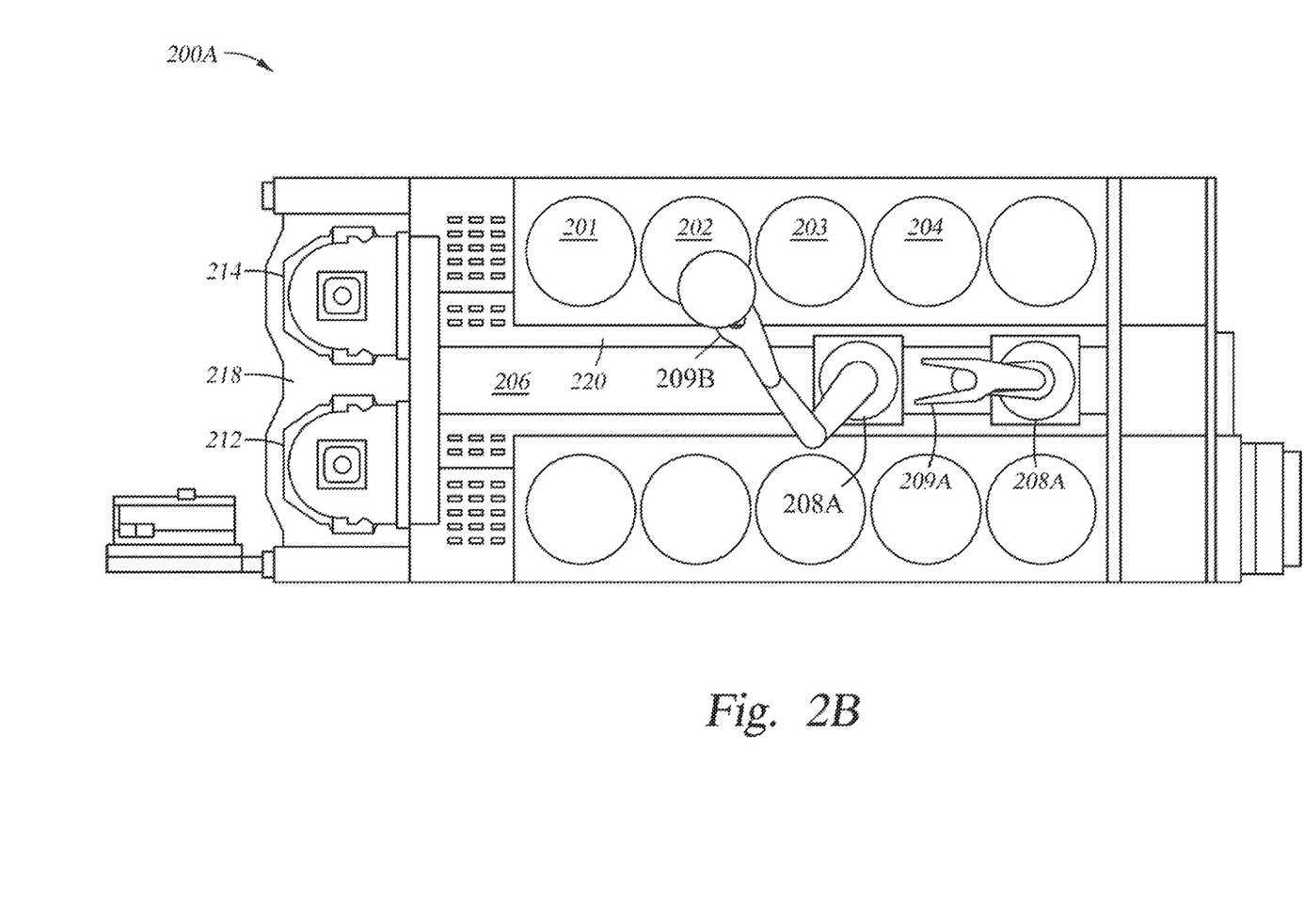
FIG. 2B illustrates a plan view of a processing apparatus according to one embodiment described herein.

In an alternate embodiment, as shown in FIG. 2B, the processing apparatus 200A may be a linear apparatus comprising several substrate processing chambers such as the wet clean chamber 201, the solvent exchange chamber 202, the supercritical fluid chamber 203, the post processing chamber 204, and the transfer chamber 206. For example, the processing apparatus 200A may be the Raider® GT available from Applied Materials, Santa Clara, Calif., however it is contemplated that other processing apparatuses from other manufacturers may be adapted to perform the embodiments described herein.

The chambers 201, 202, 203, 204 may be positioned about a robot 208A which may be disposed in the transfer chamber 206. The robot 208A comprises a motor, a base, an arm, and end effectors 209A and 209B configured to transfer substrates between the chambers. The robot 208A may have multiple arms and multiple end effectors to increase the throughput of the processing apparatus 200A. In one embodiment, the robot 208A, having a dedicated wet end effector 209A, transfers substrates between the aforementioned chambers. The processing apparatus 200A may also comprise a factory interface 218 which may be coupled to the processing apparatus 200 and a plurality of substrate cassettes 212 and 214, each holding a plurality of substrates to be cleaned or dried, or that have been cleaned or dried. The robot 208A having the dedicated dry end effector 209B, transfers substrates between the cassettes 212 and 214 and the wet clean chamber 201 and post processing chamber 204. In one embodiment, the dedicated dry end effector 209B may be configured to transfer substrates between the supercritical fluid chamber 203 and the post processing chamber 204. The chambers within the processing apparatus 200A may be placed on a horizontal platform which houses the substrate transfer chamber 206. In another embodiment, a portion of the platform may be oriented in a position other than a horizontal orientation (See FIG. 5).

In some configurations of the processing apparatus 200A, the robot 208A may travel along a linear track 220. Chambers may be arranged in sequence on one or both sides of the linear track 220. To perform wet substrate transfer, excess liquid may be remove from the substrate, such as by rotating the substrate, while still in the chamber so only a thin wet layer remains on the substrate surface before the robot 208A transfers the substrate. In embodiments providing two or more end effectors on the robot 208A, at least one may be dedicated to wet substrate transfer and the other one may be dedicated to dry substrate transfer. More chambers may be installed in the extendable linear configuration for high-volume production.

The configurations referred to in the previous embodiments greatly reduce design complexities of each chamber, enable queue time control between sensitive process steps, and optimize throughput in continuous production with adjustable chamber module count to equalize process duration of each processing operation.

Figure 3:
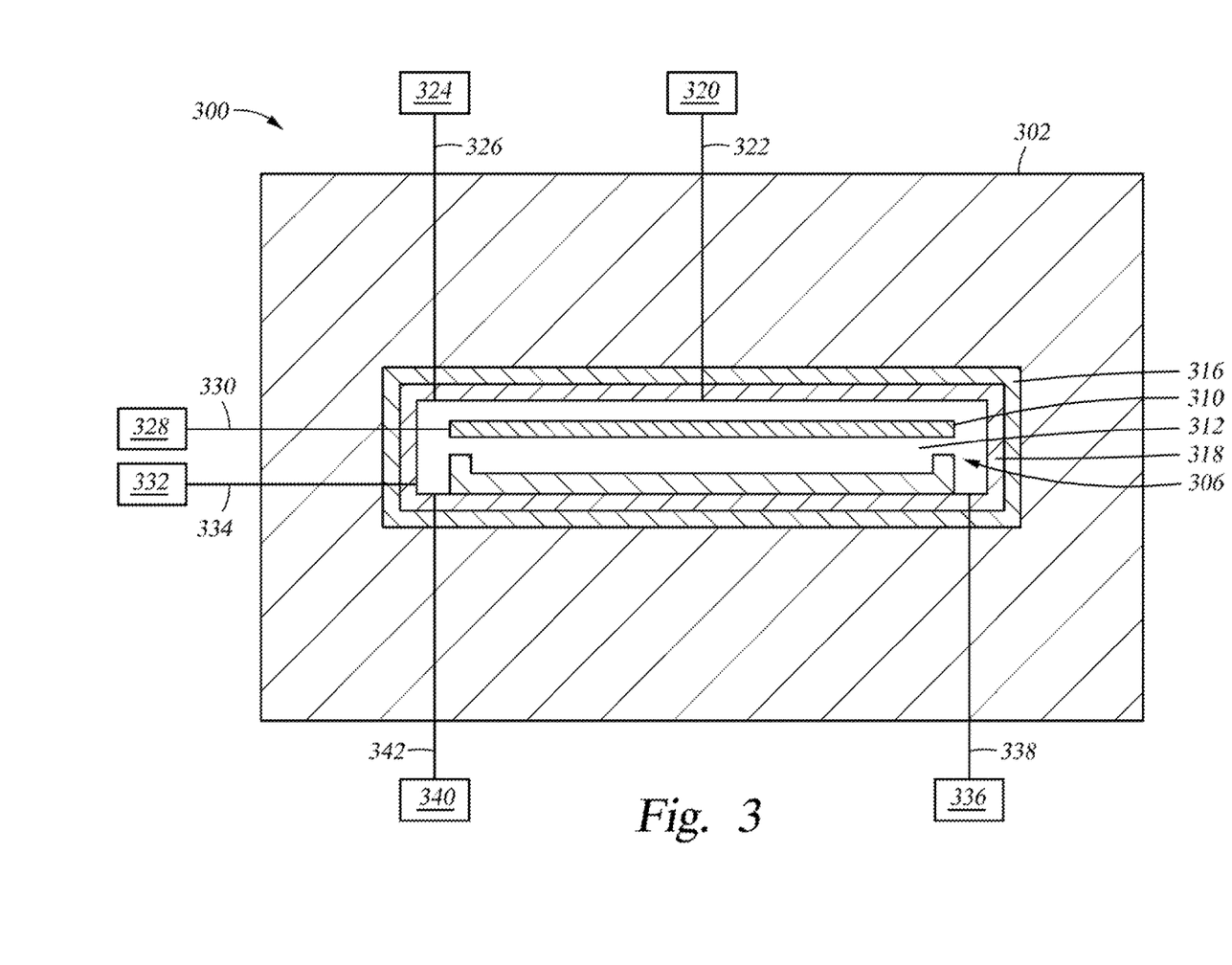
FIG. 3 schematically illustrate a cross-sectional view of a processing chamber according to one embodiment described herein.

FIG. 3 schematically illustrates a cross-sectional view of a processing chamber 300 according to one embodiment described herein. In certain embodiments, the chamber 300 may be implemented as the chamber 203 described with regard to FIG. 2A and FIG. 2B. Generally, the chamber 300 is configured to withstand pressurization suitable for generation and/or maintenance of a supercritical fluid therein. The chamber 300 may also be advantageously cycled within a temperature range suitable for performing phase transitions.

The chamber 300 includes a body 302, a liner 318, and an insulation element 316. The body 302 and the liner 318 generally define a processing volume 312. The body 302 may be configured to withstand pressures suitable for generating a supercritical fluid within the processing volume 312. For example, the body may be suitable for withstanding pressures of about 100 bar or greater. Suitable materials for the body 302 include stainless steel, aluminum, or other high strength metallic materials. The liner 318 may also be formed from materials similar to the body 302. In one embodiment, the liner 318 and the body 302 may be a unitary apparatus. In another embodiment, the liner 318 and the body 302 may be separate apparatus coupled together.

The liner 318, at regions adjacent the processing volume 312, may have a thickness of between about 2 mm and about 5 mm, such as about 3 mm. The relatively minimal amount of material comprising the liner 318 compared to the body 302 causes the liner 318 to have a small thermal mass relative to the thermal mass of the body 302. Accordingly, temperature changes within the processing volume 312 may be made in a more efficient manner as the temperature of the processing volume 312 is influenced predominantly by the liner 318, rather than the body 302. In one embodiment, a processing environment within the processing volume 312 may be cycled between about 20° C. and about 50° C. in an amount of time less than about 5 minutes, for example less than about 1 minute. In one embodiment, the processing volume 312 may be cycled between about 20° C. and about 50° C. in about 30 seconds.

The insulation element 316 is generally disposed within the body 302 adjacent the liner 318. The insulation element 316 may be formed form a material suitable for use in a high pressure environment which has a coefficient of thermal expansion similar to the coefficient of thermal expansion for the materials utilized for the body 302 and the liner 318. In one embodiment, the insulation element 316 may be a ceramic material. Various examples of ceramic materials include aluminum oxide, aluminum nitride, silicon carbide, and the like. A thickness of the insulation element 316 may be between about 0.1 inches and about 1.0 inch, such as about 0.5 inches.

The processing volume 312 has a volume of less than about 2 liters, for example, about 1 liter. In various embodiments, the processing volume 312 may be filled with various liquids, gases, and/or supercritical fluids depending on the conditions in the processing volume 312. In one embodiment, the processing volume 312 may be coupled to one or more solvent sources 320, 332, 336. A first solvent source 320 may be coupled to the processing volume 312 via a first conduit 322 through a top of the body 302. A second solvent source 332 may be coupled to the processing volume 312 via a second conduit 334 through a sidewall of the body 302. A third solvent source 336 may be coupled to the processing volume 312 via a third conduit 338 through a bottom of the body 302. The solvent sources 320, 332, 336 may be configured to provide solvents to the processing volume from various entry ports, depending upon desired solvent introduction characteristics.

Suitable solvents which may be supplied to the processing volume 312 from the solvent sources 320, 332, 336 include acetone, isopropyl alcohol, ethanol, methanol, N-Methyl-2-pyrrolidone, N-Methylformamide, 1,3-Dimethyl-2-imidazo-lidinone, dimethylacetamide, and dimethyl sulfoxide, among others. Generally the solvent may be selected such that the solvent is miscible with liquid $CO_2$.

A first fluid source 324 may be coupled to the processing volume 312 via fourth conduit 326 through the top of the body 302. The first fluid source 324 is generally configured to provide a liquid or supercritical fluid to the processing volume 312. In one embodiment, the first fluid source 324 may be configured to deliver supercritical $CO_2$. In another embodiment, the fluid source 324 may be configured to deliver supercritical $CO_2$ to the processing volume 312. In this embodiment, heating apparatus and pressurization apparatus may be coupled to the fourth conduit 326 to facilitate phase transition of liquid $CO_2$ to supercritical $CO_2$ prior to entry into the processing volume 312. In another embodiment, the third solvent source 336 is a second fluid source similarly configured to the first fluid source 324. Alternatively, the second fluid source may be utilized in addition and/or in combination with the third solvent source 336. In this embodiment, the second fluid source may be coupled to the processing volume via a fifth conduit 338 through the bottom of the body 302. Delivery of liquid $CO_2$ and/or supercritical $CO_2$ may be selected from a top down (first fluid source 324) or bottom up (second fluid source) scheme, depending upon desired processing characteristics.

In operation, temperature of the processing volume 312 may be controlled, at least in part, by the temperature of the $CO_2$ provided to the processing volume 312. Additionally, liquid $CO_2$ and/or supercritical $CO_2$ may be provided to the processing volume 312 in an amount such that the entire processing volume is exchanged between about 1 time and about 5 times, for example, about 3 times. It is believed that repetitive processing volume turnover may facilitate solvent mixing with the $CO_2$ prior to formation of and/or delivery of supercritical $CO_2$ to the processing volume 312 during subsequent supercritical drying operations. To facilitate turnover and removal of fluids and gases from the processing volume 312, the processing volume 312 may be coupled to a fluid outlet 340 via a sixth conduit 342.

The chamber 300 also includes a substrate support 306 which may be configured to interface with a baffle plate 310. In one embodiment, the baffle plate 310 may be movably disposed within the processing volume 312. The substrate support 306 may be formed from various materials, including stainless steel, aluminum, ceramic material, polymeric materials or combinations thereof. In operation, the substrate support 306 may enter the processing volume 312 via an opening (not shown) formed in the body 302. Generally, a substrate (not shown) may be positioned on the substrate support 306 prior to entry of the substrate support 306 in to the processing volume.

The baffle plate 310 may be formed from various materials, including stainless steel, aluminum, ceramic materials, quartz materials, silicon containing materials, or other suitably configured materials. The baffle plate 310 may be coupled to an actuator 330 configured to move the baffle plate 310 towards and away from the substrate support 306. The actuator 330 may be coupled to a power source 328, such as an electrical power source to facilitate movement of the baffle plate 310 within the processing volume 312. In another embodiment, the baffle plate 310 may be positioned on or coupled to the substrate support 306 prior to entry into the processing volume 312. In this embodiment, a substrate is positioned on the substrate support 306 and the baffle plate 310 may be positioned on the substrate support 306 to enclose the substrate between the substrate support 306 and the baffle plate 310.

As described above, the substrate may be positioned on the substrate support 306 during processing. In one embodiment, a device side of the substrate may be positioned adjacent the substrate support 306 such that the device side faces away from the baffle plate 310. In embodiments where the baffle plate is positioned in the processing volume 312 and coupled to the actuator 330, the baffle plate 310 may be in a raised position when the substrate support 306 is being positioned within the processing volume 312. The baffle plate 310 may be lowered via the actuator 330 to a processing position in close proximity with the substrate during processing. In certain embodiments, the baffle plate 310 may contact the substrate support 306 during substrate processing. After processing, the baffle plate 310 may be raised and the substrate support 306 may remove the substrate from the processing volume 312 through the opening in the body 302. It is believed that by positioning the baffle plate 310 in close proximity with the substrate and the substrate support 306, particle deposition on the device side of the substrate 308 may be reduced or eliminated during introduction of solvents and/or liquid/supercritical $CO_2$ to the processing volume 312.

Figure 4:
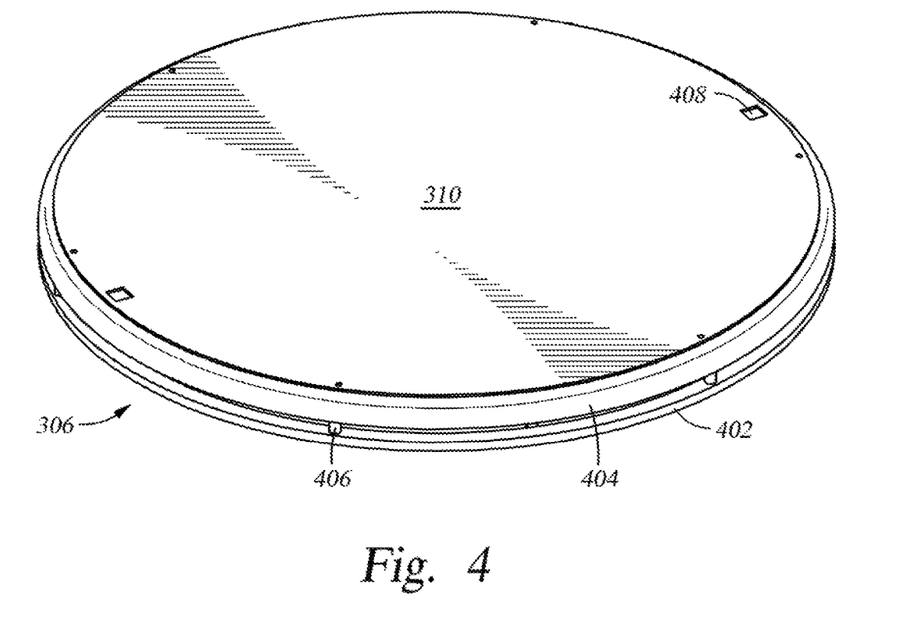
FIG. 4 illustrates a perspective view of a substrate support and a baffle plate according to one embodiment described herein.

FIG. 4 illustrates a perspective view of the substrate support 306 and the baffle plate 310 according to one embodiment described herein. Terminology utilized herein, such as "top," "bottom," "inner," "outer," and the like is intended to describe without obscuring the disclosure. The terminology is not to be construed as absolute directions, as the apparatus may be oriented in multiple advantageous orientations. The illustrated embodiment depicts the baffle plate 310 disposed on the substrate support 306. This configuration is representative of the orientation of the baffle plate 310 and the substrate support 306 when a substrate is being processed in the chamber 300. Although not shown, the substrate is positioned on the substrate support 306 and the baffle plate 310 covers the substrate such that the substrates exposure to fluid agitation is minimized.

The substrate support 306 includes a base plate 402, a plurality of spacers 406, and a ring body 404. The base plate 402 may be circular in shape and the spacers 406 are coupled between the base plate 402 and the ring body 404 about the circumference of the base plate 402. In one embodiment, the base plate 402, the spacers 406 and the ring body 404 may be formed from the same material, such as a metallic material or a ceramic material. Suitable examples of material include stainless steel, aluminum, and quartz, among others. In another embodiment, the base plate 402 and the ring body 404 may be formed from a metallic material, such as stainless steel, and the spacers 406 may be formed from a polymeric material, such as poly(tetrafluoroethylene).

The base plate 402 and the ring body 404 may be sized to have a diameter larger than a diameter of the substrate to be positioned thereon. For example, if the substrate has a 300 mm diameter, the diameter of the ring body 404 and the base plate 402 may be between about 305 mm and about 310 mm. The diameter of the baffle plate 310 may also be greater than the diameter of the substrate in certain embodiments. Generally, the baffle plate 310 is configured to contact and be supported by the ring body 404. The baffle plate 402 may also include voids 408 sized to interface with a robot to facilitate transfer of the baffle plate 310 via the robot.

Figure 5:
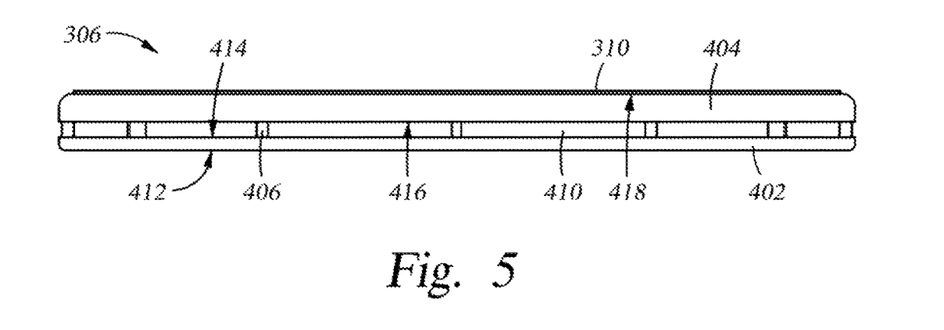
FIG. 5 illustrates a side view of a substrate support and a baffle plate according to one embodiment described herein.

FIG. 5 illustrates a side view of the substrate support 306 and the baffle plate 310 according to one embodiment described herein. The base plate 402 is generally configured with a bottom surface 412 and a top surface 414 disposed opposite the bottom surface 412. Similarly, the ring body 404 is configured with a bottom surface 416 and a top surface 418 disposed opposite the bottom surface 416. The spacers 406 may extend from the top surface 414 of the base plate 402 to the bottom surface 416 of the ring body 404 to position the ring body 404 a distance from the base plate 402. Apertures 410 may be formed between the base plate 402 and the ring body 404 in a discontinuous fashion (interrupted by the position of the spacers 406) and the apertures 410 may be configured to allow for fluid flow radially inward from the circumference of the base plate 402 and the ring body 404. The apertures 410 may also allow for fluid flow radially outward beyond the circumference of the base plate 402 and the ring body 404 from an origin of the base plate 402 and the ring body 404.

Figure 6:
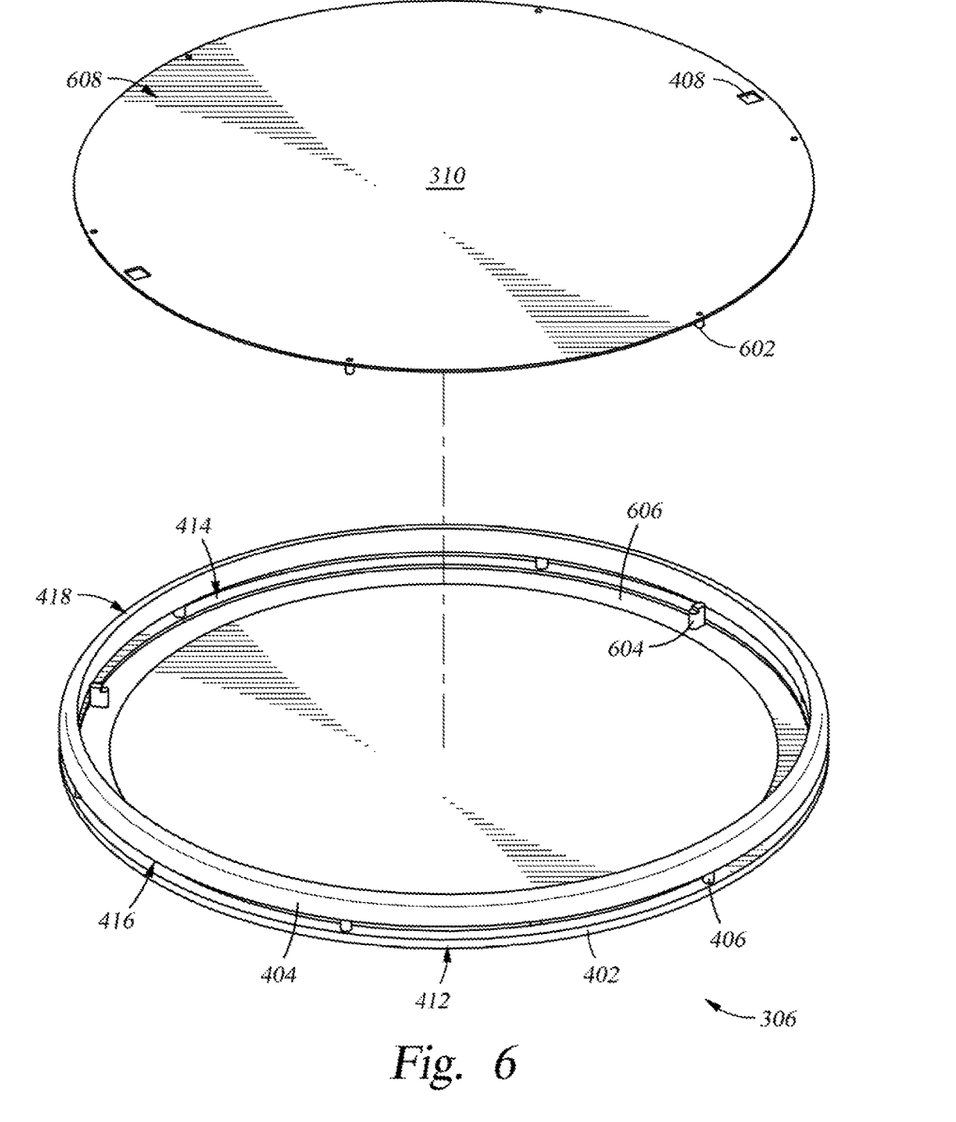
FIG. 6 illustrates an exploded plan perspective view of a substrate support and a baffle plate according to one embodiment described herein.

FIG. 6 illustrates an exploded plan perspective view of the substrate support 306 and the baffle plate 310 according to one embodiment described herein. One or more support posts 604 may be coupled to and extend from a lip 606 of the base plate 402. In one embodiment the lip 606 may comprise the top surface of the base plate 402. In other embodiments, the lip 606 may not be present such that the top surface of the base plate 402 is substantially planar along the entire diameter of the base plate 402. The support posts 604 may be formed from various materials, including polymeric materials, such as (poly)tetrafluoroethylene, quartz materials, carbon containing materials, ceramic materials, and the like. The support posts 604 are described in greater detail with regard to FIG. 8 and FIG. 9.

The baffle plate 310 includes a top surface 608 and one or more positioning elements 602 may extend from a surface of the baffle plate 310 oriented opposite the top surface 608. The positioning elements 602 may be formed from the same materials as the support posts 604 in certain embodiments. In other embodiments, the positioning elements 602 may be formed from metallic materials. Generally, the positioning elements 602 are configured to secure and/or prevent lateral movement of the baffle plate 310 when the baffle plate 310 is positioned in contact with the ring body 404 (See FIG. 4). The positioning elements 602 are described in greater detail with regard to FIG. 10.

Figure 7:
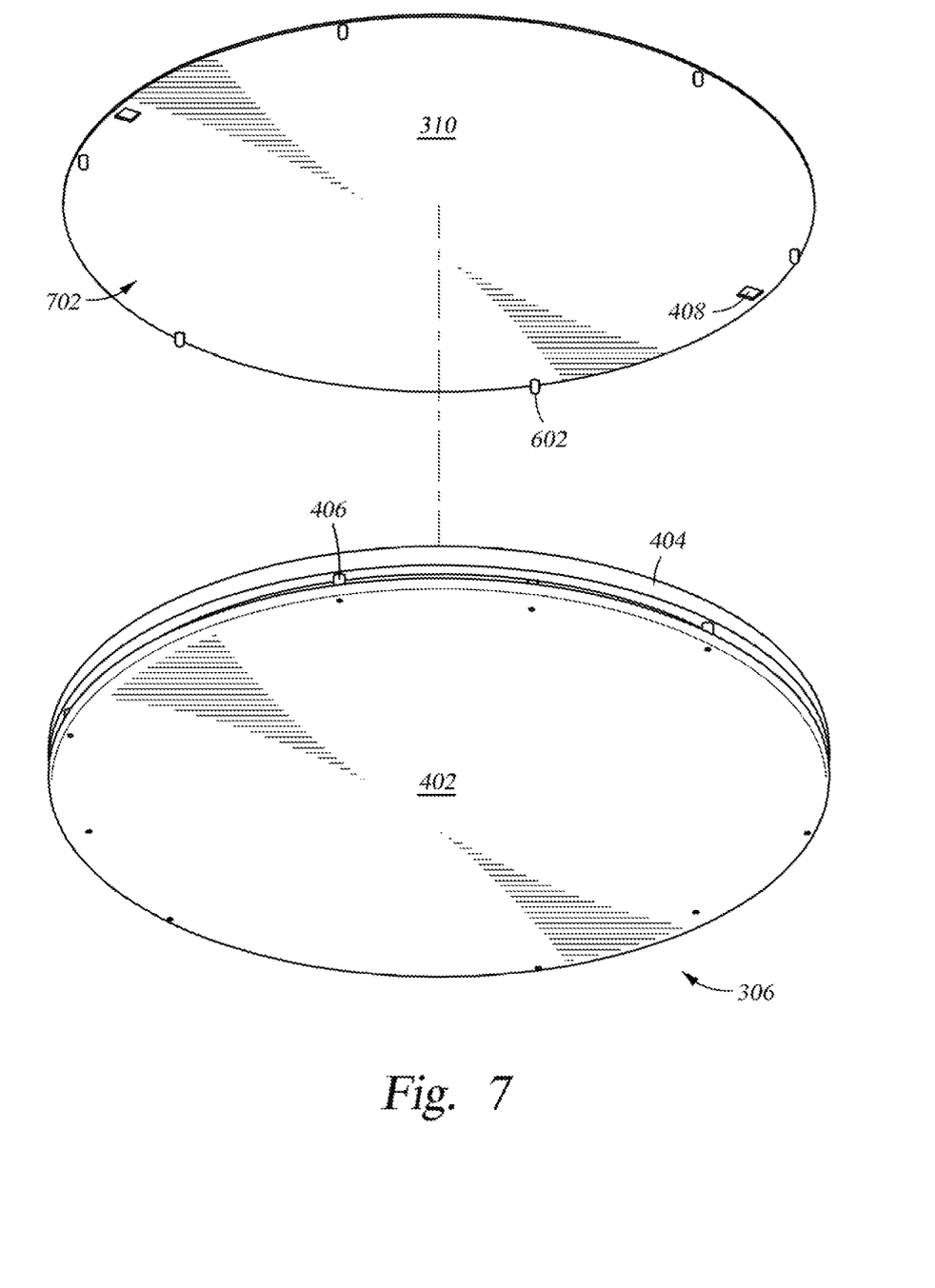
FIG. 7 illustrates an exploded bottom perspective view of a substrate support and a baffle plate according to one embodiment described herein.

FIG. 7 illustrates an exploded bottom perspective view of the substrate support 306 and the baffle plate 310 according to one embodiment described herein. As illustrated, the positioning elements 602 may be coupled to a bottom surface 702 of the baffle plate 310 and positioned about the circumference of the baffle plate 310.

Figure 8:
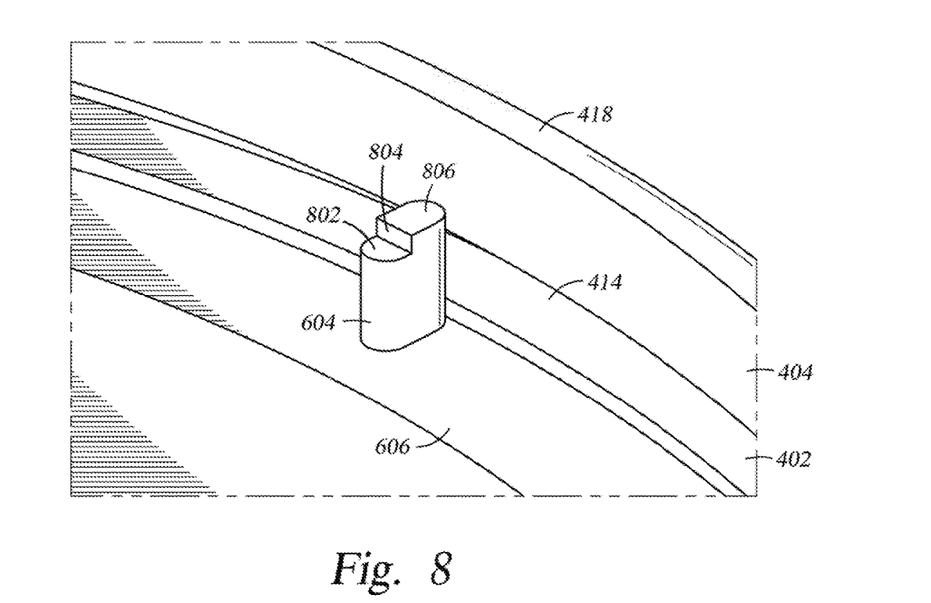
FIG. 8 illustrates a partial perspective view of a substrate support and a support post according to one embodiment described herein.

FIG. 8 illustrates a partial perspective view of the substrate support 306 and the support posts 604 according to one embodiment described herein. Although only a single support post is illustrated, multiple support posts 604 are coupled to the base plate 402. The support posts 604 include a first surface 802, a second surface 804, and a third surface 806. The first surface 802 is sized to support the edge of a substrate. In one embodiment, the first surface 802 may be configured to support the device side of a substrate. The first surface 802 may be curved at an inner edge thereof to provide a curved contact surface for supporting a substrate. The curved contact surface may reduce scratching of the substrate by the inner edge of the first surface 802. The second surface 804 may extend from the first surface 802 in a direction normal, or not normal, to a plane defined by the first surface 802. The second surface 804 may be sized and configured to prevent lateral movement of a substrate positioned on the support posts 604. The third surface 806 may extend from the second surface 804 in a direction normal to a plane defined by the second surface 804. In this embodiment, the third surface 806 is elevated from, and parallel to, the first surface 802, but the third surface 806 need not be parallel to the first surface 802. The third surface 806 is generally disposed below the top surface 418 of the ring body 404.

Figure 9:
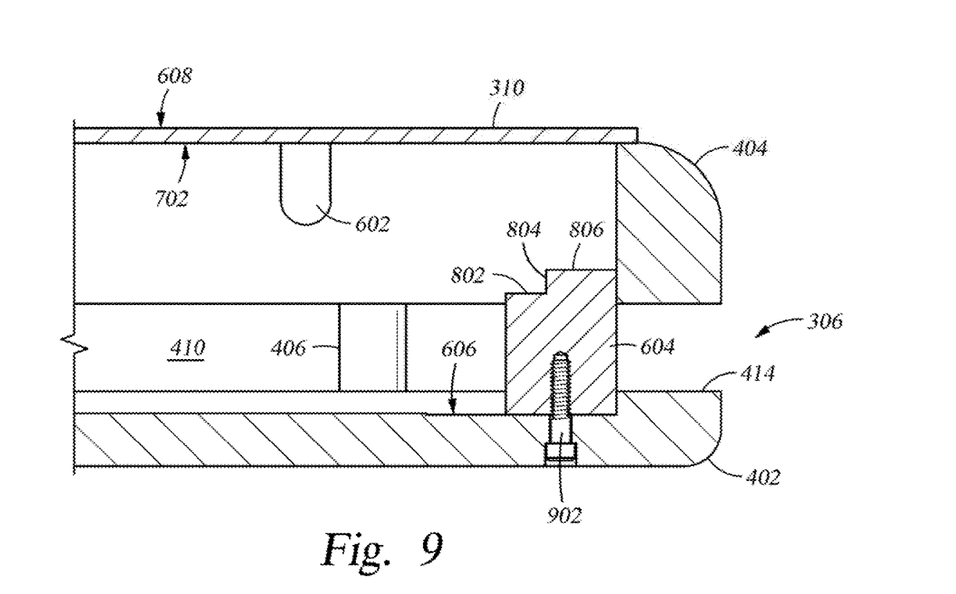
FIG. 9 illustrates a partial cross-sectional view of a substrate support, a support post, and a baffle plate according to one embodiment described herein.

FIG. 9 illustrates a partial cross-sectional view of the substrate support 306, the support posts 604, and the baffle plate 310 according to one embodiment described herein. As depicted, the support posts 604 may be coupled to the base plate 402. A fastener 902, such as a screw or bolt, may extend through the base plate 402 and may be threadably coupled to the to the support posts 604. Other fastening schemes, such as press fitting, gluing, or the like may also be utilized. However, it is contemplated that the fastening scheme utilized may be compatible with the temperatures, pressures, and chemistries utilized during a phase change process in the chamber 300.

As shown in FIG. 9, when assembled, the ring body 404 is spaced from the base plate 402 by the spacers 406. A minimum distance between the ring body 404 and the base plate 402 may be less than a height of the support posts 604 in some embodiments. While the aforementioned embodiments describe apparatus, such as the support posts 604, to support a substrate thereon, it is contemplated that other apparatus may be utilized to support a substrate. For example, a ledge member (not shown) or the like may extend radially inward from the ring body 404 or the base plate 402. The ledge member may have a substrate supporting surface configured to support the device side of a substrate. In one embodiment, the ledge member may be a continuous ledge extending from an inner surface 1006 (See FIG. 10) of the ring body 404. In another embodiment, the ledge member may be a discontinuous ledge (i.e. multiple discrete ledges) extending from the inner surface 1006. In yet another embodiment, the ledge member may extend from the base plate 402 and may have apertures formed therein aligned with the apertures 410 to facilitate fluid flow through the apertures 410. It is contemplated that various other substrate support apparatus, such as pins, rings, or other suitably configured apparatus may be advantageously incorporated into the substrate support 306.

Figure 10:
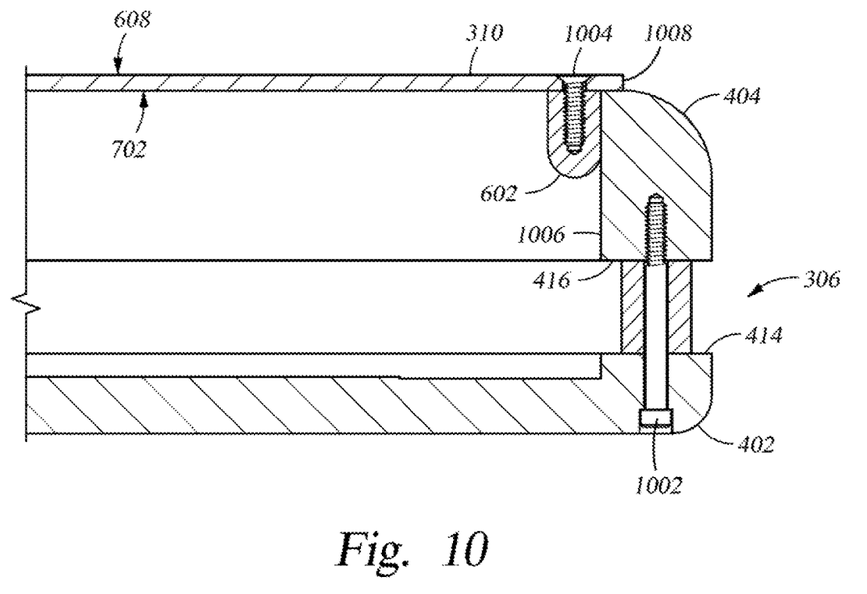
FIG. 10 illustrates a cross-sectional view of a substrate support, a spacer, and a baffle plate positioning element according to one embodiment described herein.

FIG. 10 illustrates a cross-sectional view of the substrate support 306, the spacers 406, and the baffle plate 310 positioning element according to one embodiment described herein. As previously described, the spacers 406 position the ring body 404 relative to the base plate 402. The spacers 406 may be coupled between the base plate 402 and the ring body 404 by a fastener 1002. The fastener 1002 may extend through the base plate 402 and the spacers 406 and be threadably coupled to the ring body 404. Other fastening schemes, such as those described above with regard to FIG. 9 may also be utilized to secure the spacers 406 between the base plate 402 and the ring body 404.

The positioning elements 602 may be coupled to the bottom surface 702 of the baffle plate 310 by a fastener 1004. The fastener 1004 may extend through the baffle plate 310 and be threadably coupled to the positioning elements 602. Other fastening schemes, such as those described above with regard to FIG. 9 may also be utilized to secure the positioning elements 602 to the baffle plate 310. The positioning elements 602 may be coupled to the baffle plate 310 a distance radially inward from a circumference of the baffle plate 310. A region 1008 of the baffle plate 310 may be configured to contact the ring body 404 when the baffle plate 310 is positioned on the ring body 404. The positioning elements 602 may be configured to abut the inner surface 1006 of the ring body 404 to prevent lateral movement of the baffle plate 310 relative to the ring body 404.

Figure 11:
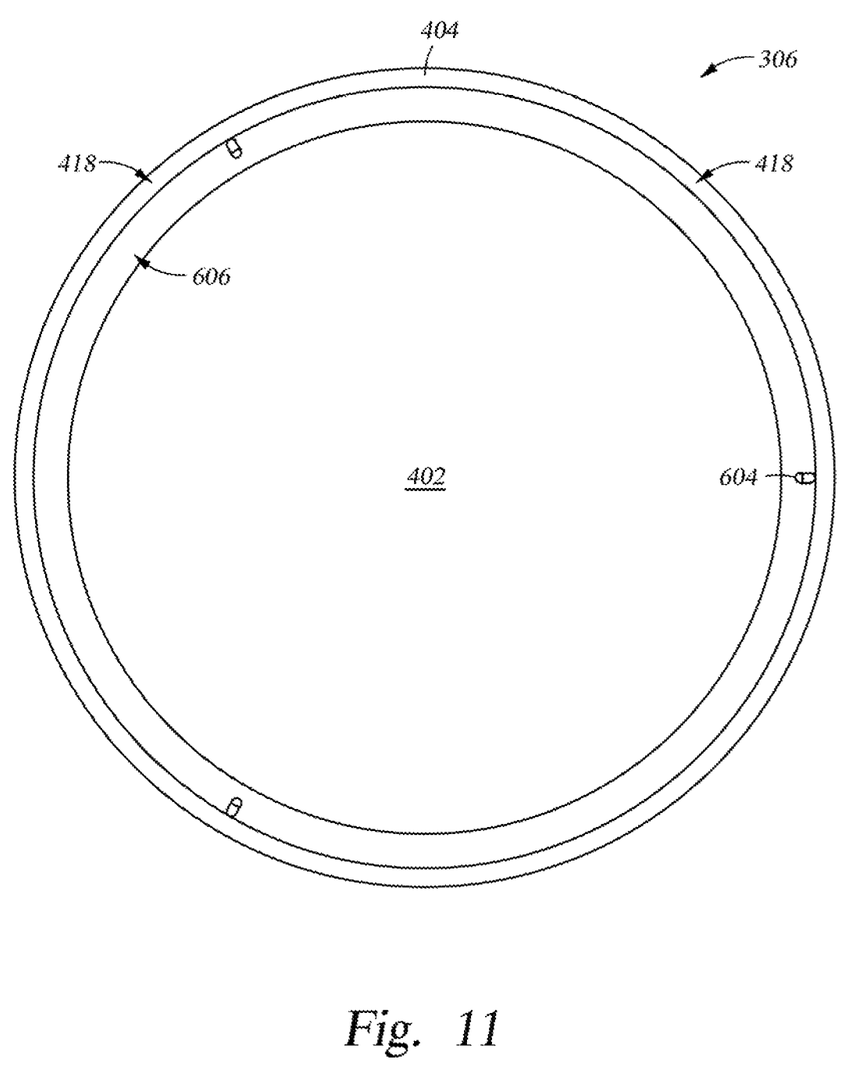
FIG. 11 illustrates plan view of a substrate support according to one embodiment described herein.

FIG. 11 illustrates plan view of the substrate support 306 according to one embodiment described herein. The support posts 604 may be coupled in regions circumferentially about the lip 606 of the base plate 402. In one embodiment, the support posts 604 may be disposed equidistant from one another, for example, about 120° from one another. In the illustrated embodiment, three support posts 604 are shown, however it is contemplated that a greater number of support posts 604 may also be utilized.

The embodiments described herein regarding the substrate support 306 and baffle plate 310 are believed to reduce particle deposition on a substrate during solvent exposure, phase transition, and/or supercritical processing. The substrate support 306 and baffle plate 310 may be advantageously implements in a pressurized chamber, such as the chamber 300. By preventing exposure of the substrate directly to non-laminar fluid flows and agitate fluid flows or the like, particles present in the fluids may avoid deposition on the substrate. For example, eddy current fluid flows may exist in regions around the substrate support 306 and the baffle plate 310, however, an internal volume defined by the substrate support 306 and the baffle plate 310 having the substrate positioned therein may only contain low velocity fluid flows or laminar fluid flows. It is also believed that the baffle plate 310, in combination with orientation of the substrate in a device side down orientation, may reduce or eliminate particle deposition on the substrate.

While the foregoing is directed to embodiments of the present disclosure, other and further embodiments of the disclosure may be devised without departing from the basic scope thereof, and the scope thereof is determined by the claims that follow.

What is claimed is:

1. A substrate support apparatus, comprising:
    a circular base plate;
    one or more spacers disposed about a circumference of the base plate, the spacers extending from a top surface of the base plate;
    a ring body coupled to the spacers, wherein the ring body is spaced from the base plate to define apertures between the base plate and the ring body; and
    one or more support posts coupled to the base plate and extending therefrom, wherein the support posts are coupled to the base plate at positions radially inward from an inner surface of the ring body, each support post having a substrate receiving surface, wherein a minimum distance between the ring body and the base plate is less than a height of the support posts.

2. The apparatus of claim 1, wherein the spacers are formed from a polymeric material.

3. The apparatus of claim 1, wherein the base plate has a lip, and the support posts are coupled to the base plate at the lip.

4. The apparatus of claim 3, wherein the spacers are fixed to the base plate by one or more fasteners.

5. The apparatus of claim 1, wherein the substrate receiving surface is curved.

6. A substrate processing apparatus, comprising:
    a circular base plate;
    one or more spacers disposed about the circumference of the base plate, the spacers extending from a top surface of the base plate;
    a ring body coupled to the spacers, wherein the ring body is spaced from the base plate to define apertures between the base plate and the ring body;
    one or more support posts coupled to the base plate and extending therefrom, wherein the support posts are coupled to the base plate at positions radially inward from an inner surface of the ring body; and
    a circular baffle plate coupled to a top surface of the ring body, wherein one or more positioning elements extend from a bottom surface of the baffle plate and the positioning elements are disposed about a circumference of the baffle plate.

7. The apparatus of claim 6, wherein the spacers are formed from a polymeric material.

8. The apparatus of claim 6, wherein the base plate has a lip, and the support posts are coupled to the base plate at the lip.

9. The apparatus of claim 8, wherein the spacers are fixed to the base plate by one or more fasteners.

10. The apparatus of claim 6, wherein each support post has a substrate receiving surface.

11. The apparatus of claim 10, wherein the substrate receiving surface is curved.

12. The apparatus of claim 10, wherein a minimum distance between the ring body and the base plate is less than a height of the support posts.

13. The apparatus of claim 6, wherein a number of spacers is twice a number of support posts.

14. The apparatus of claim 7, wherein each support post has a curved substrate receiving surface.

15. A substrate support method, comprising:
    positioning a substrate, device side down, on one or more support posts coupled to a base plate of a substrate support, wherein a ring body is coupled to the base plate and positioned about a circumference of the substrate;

positioning a baffle plate over the substrate and coupling the baffle plate to the ring body; and positioning the substrate, the substrate support, the ring body, and the baffle plate in a processing chamber.

16. The method of claim 15, wherein positioning the baffle plate over the substrate comprises engaging a plurality of voids in the baffle plate with a robot.

17. The method of claim 16, wherein the ring body is spaced apart from the base plate.

18. The method of claim 17, wherein the support posts maintain a separation between the substrate and the ring body.

* * * * *